United States Patent [19]

Chang

[11] 4,282,043

[45] Aug. 4, 1981

[54] PROCESS FOR REDUCING THE INTERDIFFUSION OF CONDUCTORS AND/OR SEMICONDUCTORS IN CONTACT WITH EACH OTHER

[75] Inventor: Chin-An Chang, Peekskill, N.Y.

[73] Assignee: International Business Machines Corporation, Armonk, N.Y.

[21] Appl. No.: 124,187

[22] Filed: Feb. 25, 1980

[51] Int. Cl.³ .................. H01L 29/46; B32B 15/04; H01L 21/283

[52] U.S. Cl. .................. 148/1.5; 357/65; 428/672

[58] Field of Search .......... 428/672; 148/1.5; 1/13; 357/65

[56] References Cited

U.S. PATENT DOCUMENTS

| | | | |
|---|---|---|---|
| 3,982,908 | 9/1976 | Arnold | 29/195 |
| 4,065,588 | 12/1977 | Arnold | 427/89 |
| 4,110,488 | 8/1978 | Risko | 427/84 |
| 4,172,906 | 10/1979 | Pancholy | 427/82 |

OTHER PUBLICATIONS

C. A. Chang, J. Electrochem. Soc. 127 (1980) 1331.
C. A. Chang et al., Appl. Phys. Letts. 37 (1980) 161.
Ohkawa et al., Japan J. Appl. Phys. 14 (1975) 1589.
Hiraki et al. J. Appl. Phys. 43 (1972) 3643.
Ho et al., IBM-TDB, 21 (1978) 1752.

Primary Examiner—Upendra Roy
Attorney, Agent, or Firm—Pollock, Vande Sande & Priddy

[57] ABSTRACT

The interdiffusion at the interface between a metallic-type conductor or semiconductor and a second metallic-type conductor or semiconductor in intimate contact therewith due to elevated temperatures is reduced by subjecting a surface of at least one of the materials when at an elevated temperature to a gas which contains at least one component which changes the surface potential and work function of the surface which is subjected to the gas in a direction according to the relative electronegativities of the materials.

20 Claims, 2 Drawing Figures

PROCESS FOR REDUCING THE INTERDIFFUSION OF CONDUCTORS AND/OR SEMICONDUCTORS IN CONTACT WITH EACH OTHER

DESCRIPTION

1. Technical Field

The present invention is concerned with reducing the interdiffusion when subjected to elevated temperatures of a metallic-type electrical conductor or semiconductor and a second and different metallic-type electrical conductor or semiconductor which are in intimate contact with each other. The process of the present invention is suitable for various processing steps or preparing an article which involves elevated temperatures and is also suitable for preventing interdiffusion during the operation of an article at elevated temperatures.

The process of the present invention is especially advantageous for use during the fabrication of metallic contacts to metallic-type conductors and/or semiconductors, and particularly when shallow junctions or interfaces are involved. The present invention is particularly concerned with employing certain controlled gaseous atmospheres during the time the article being treated is subjected to elevated temperatures.

2. Background Art

Typical semiconductor devices are multilayer structures which include a substrate of a semiconductor upon which is provided an intermediate layer of a conductor or semiconductor on top of which is provided another conductor or semiconductor layer of a material different from that of the intermediate layer. In addition, electrical contacts are normally provided on at least the top surface of the upper layer. Also, electrical contact might be provided on the underside of the semiconductor substrate. These electrical contacts are usually provided by subjecting the multilayer structure and material for the contacts to elevated temperatures to cause fusion of the materials.

This type of procedure, however, is conducive to interdiffusion or migration of the interface of the material of the intermediate layers and the material of the top layer. This interdiffusion, in turn, can result in material from the intermediate layer contaminating the top surface of the upper layer thereby significantly altering the electrical characteristics of the article. This can also result in the material from the top layer migrating all the way to the underside of the semiconductor substrate, thereby causing short circuiting.

In order to minimize the interdiffusion, the heating is normally carried out in an inert atmosphere. However, the problem of interdiffusion still persists and is especially detrimental when preparing devices having shallow junctions or interfaces.

In addition, when various semiconductor devices are operated, depending upon their particular intended use, they may be subjected to very high temperatures. Thus, the operation, when at elevated temperature and depending upon the environment, can eventually result in failure of the device due to interdiffusion of adjacent conductive and/or semiconductive layers.

DISCLOSURE OF INVENTION

The present invention is concerned with reducing the interdiffusion when subjected to elevated temperatures of a first metallic-type conductor or semiconductor and a second and different metallic-type electrical conductor or semiconductor which is adjacent to and in intimate contact with the first metallic-type electrical conductor and/or semiconductor. The first metallic-type electrical conductor and/or semiconductor and the second and different metallic-type electrical conductor and/or semiconductor have different electronegativities. The electronegativity of a material is the measure of the ability of the material to attract electrons. The greater the ability, the higher the electronegativity of the material.

The term "metallic-type" as used herein refers to electronically conductive metals, electrically conductive mixtures of metals, electrically conductive metal alloys, as well as nonmetallic materials, such as highly doped polycrystalline silicon or intermetallic silicides which, nevertheless, have electrical conductivities of the magnitude generally possessed by metals.

The process of the present invention comprises subjecting or exposing at least one surface of at least one of the metallic-type electrical conductors or semiconductors when at elevated temperature to a gas. The gas contains at least one type of molecule which changes the surface potential of the exposed metallic-type conductor and/or semiconductor by increasing its work function when it is more electronegative than the other metallic-type conductor and semiconductor or by decreasing its work function when it is less electro-negative than the other metallic-type conductor or semiconductor, thereby reducing the interdiffusion of the conductors and/or semiconductors.

The work function is the theshold energy needed to release the electron from the surface. Work function can be measured by the energy of light needed to cause release of an electron from the surface of a particular material according to procedure specified in B. Gysae and S. Wagener; Z. Physik, 115,296 (1940); and J. C. P. Mignolet: Discussions Faraday Society, 8, 326 (1950).

BEST AND VARIOUS MODES FOR CARRYING OUT INVENTION

Figure 1:
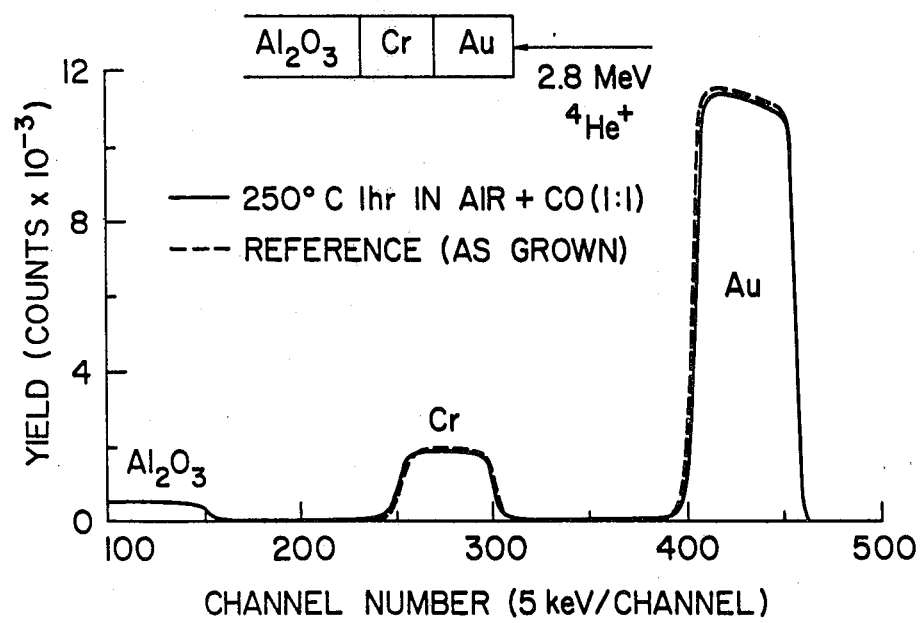
FIGS. 1 and 2 are graphs illustrating the backscattering results obtained by subjecting $Au-Cr-Al_2O_3$ structures to elevated temperatures in different atmospheres.

The structures which are subjected to the process of the present invention include at least two layers adjacent to and in intimate contact with each other. One of the layers contains a first metallic-type electrical conductive material and/or semiconductor, while the other layer contains a second and different metallic-type electrical conductive material and/or semiconductor. The electronegativity of the first conductor and/or semiconductor is different from that of the second conductor and/or semiconductor.

The metallic-type material can be an electrically conductive metal, mixture of electrically conductive metals, electrically conductive metallic alloys, as well as nonmetallic materials, such as highly doped polysilicon or intermetalic silicides which, nevertheless, have electrical conductivities of the magnitude generally possessed by metals. In addition, the metallic-type layer can contain nonconducting materials as long as such do not destroy the conductivity characteristics of the layer to an undesired extent.

Examples of some metallic-type materials advantageously processed according to the present invention include gold, chromium, cobalt, copper, palladium, platinum, and aluminum. The present invention also contemplates treatment of layers containing semiconductive materials, such as silicon, polycrystalline silicon, and GaAs. Moreover, the layers treated can contain mixtures of metallic type materials and semiconductors.

The preferred structures treated according to the present invention include at least two layers which are adjacent each other and in intimate contact with each other wherein one of the layers is present on top of the layers. Most preferably the top layer is of a metallic-type material.

Particular structures which are especially benefited by the present invention includes those which contain an upper layer of a metal which is very resistant to oxidation, expecially at elevated temperatures, such as gold, which is positioned on top of a layer of a different metallic-type material, such as chromium, cobalt or copper, or of a semiconductor, such as silicon, or polycrystalline silicon, or GaAs. When desired, the layers can contain mixtures or alloys of these metals. The process is most advantageous when the structures are of relatively thin layers, such as about 100 to about 5000 Å thick, and preferably about 500 to about 3000 Å thick.

Semiconductor devices employing an upper layer of gold, an intermediate layer of one or more of the other metals or semiconductors mentioned hereinabove, and a substrate of a semiconductor, such as gallium arsenide are examples of devices which can be treated according to the present invention. When fabricating such types of semiconductor devices, metallic electrical contacts are provided on the top surface of the gold at preselected locations and sometimes at the underside of the semiconductor substrate whereby an electrical connection between the two can be provided by means of wire. This processing requires the use of elevated temperatures, such as at least about 100° C., and generally up to about 500° C. Most of the structures are prepared at temperatures of about 200° to about 350° C.

However, as discussed hereinabove, when such structures are subjected to these elevated temperatures, interdiffusion at the interface between the gold, and the underlying layer, such as chromium, tends to occur. With respect to a structure which includes gold as the top surface and chromium as the intermediate or underlying layer, once interdiffusion takes place, the chromium tends to quickly migrate to the top surface of the gold, thereby causing problems with respect to reliability of the device.

For instance, since chromium is much more susceptible to oxidation than is gold, this migration could eventually result in formation of areas of chrome oxide on the top surface which would act as an insulator and hinder electrical contact with the top surface.

Migration through the gold is accelerated, since the gold layer as normally deposited by vapor deposition is polycrystalline, thereby providing pathways for the chromium or other material to migrate. Accordingly, the present invention is preferably concerned with treating those structures wherein the top surface is of a polycrystalline-type material. The gold inherently forms polycrystalline structure when prepared according to vacuum deposition in the film thicknesses experienced according to the present invention.

In addition, the interdiffusion can further cause the gold to migrate through the intermediate layer and through the semiconductive substrate, thereby causing short circuiting.

In order to minimize and, preferably, substantially eliminate this interdiffusion at the interface, it has been discovered, according to the present invention, that when the structure is subjected to elevated temperatures (e.g. about 100° C. and above), at least one surface of at least one of the metallic-type electrical conductors or semiconductors, and preferably at least the top surface of the upper layer, is exposed to a gas, wherein the gas contains at least one type of molecule which changes the surface potential of the layer exposed to the gas by increasing its work function when it is more electronegative than the layer adjacent it, or which decreases its work function when it is less electronegative than the layer adjacent it.

When the gas is a mixture of gases, the relative amount of the gas in the mixture which changes the surface potential in the manner desired is sufficient so that the effect of the mixture of gases is such as to change the surface potential in the desired manner or direction (i.e.—decrease or increase the work function as required).

The determination of whether a particular gas or mixture of gases increases or decreases the work function of a particular surface can be readily determined by persons skilled in the art by the techniques referred to hereinabove. In addition, many gases have already been tested and reported as to the manner in which such alter the work function of particular materials. Along these lines, see Somorjai, G,A.—Principles of Surface Chemistry, Prentice-Hall, Inc., Englewood Cliffs, N.J. (1972), pages 249, 158, and 159, disclosure of which is incorporated herein by reference.

The preferred structures treated according to the present invention are preferably treated by positioning the structure in a chamber with the supporting substrate facing downward on a support and the top surface of the upper layer facing upwards with the gas being supplied through the chamber. The gas upon contact with the upper surface of a polycrystalline layer, such as gold, will diffuse rapidly down to the interface, since the grain boundaries of the polycrystalline structure tend to act as pathways.

Normally, the structures are subjected to elevated temperatures at any one time for a few minutes to about two hours, and more usually from about 10 minutes to about 1 hour under normal processing and/or operating conditions.

It has been found, according to the present invention, that structures wherein the upper layer is gold and the intermediate layer is a material less electronegative than the gold, such as chromium, silicon, cobalt, and copper, that both carbon monoxide and hydrogen increase the work function of the gold layer and are suitable for carrying out the present invention. The carbon monoxide is much more effective than the hydrogen. In addition, it is noted that steam, air, and oxygen actually reduce the work function of the surface of the gold and, therefore, result in an increase in the interdiffusion of the gold and the material adjacent thereto.

It is desirable to use mixtures of carbon monoxide and another gas, such as air, so long as sufficient carbon monoxide is present in the mixture to effect the desired minimization of the interdiffusion. For instance, it was noted that a ratio of 1:1 air and carbon monoxide actually prevented the interdiffusion of gold and chromium.

In addition, it has been found, according to the present invention, that structures of platinum on top of a layer of material which is less electronegative than the platinum, such as chromium, can be processed according to the present invention employing oxygen or air. Oxygen and air actually increase the work function of platinum as opposed to its effect on the work function of gold.

In addition, certain preferred aspects of the present invention are also discussed in IBM Technical Disclosure Bulletin, Volume 21, No. 10, March 1979—"Passivating Process for the Thin Gold Layer on Silicon", by C. A. Chang, disclosure of which is incorporated herein by reference.

In order to further illustrate the present invention, the following examples are presented.

EXAMPLE I

A structure having a substrate of $Al_2O_3$ upon which is provided a layer of about 2000 to about 3000 Å chromium and a vapor deposited layer of about 2000 to about 3000 Å of gold on the chromium is provided. The structure (the gold facing upward) is subjected to temperatures of about 250° C. for one hour in a mixture of about 1:1 volume ratio of air and carbon monoxide. After this, the structure is tested for interdiffusion by using $He^+$- ion backscattering spectrometry. This procedure involves counting the number of $He^+$ ions reflected back from the sample using $He^+$ at 2.8 MeV. and the counts times $10^{-3}$ are plotted against the channel number and reproduced in FIG. 1. Also plotted in FIG. 1 is the backscattering data achieved from the same structure which has not been subjected to the elevated temperatures. As seen from FIG. 1, the 1:1 ratio of air and carbon monoxide resulted in completely stopping the interdiffusion.

EXAMPLE II

Example I is repeated except that the structure is heated in air for 1 hour at 250° C. The results obtained are presented in FIG. 2, and as apparent from FIG. 2, a comparison of that treatment with the reference shows a significant interdiffusion of the gold and chromium. Note the yield between the 300 and 400 channel numbers. As noted, for the reference within that range, the yield is about 0. On the other hand, significant yields are obtained when the heating is carried out in air.

EXAMPLE III

Figure 2:
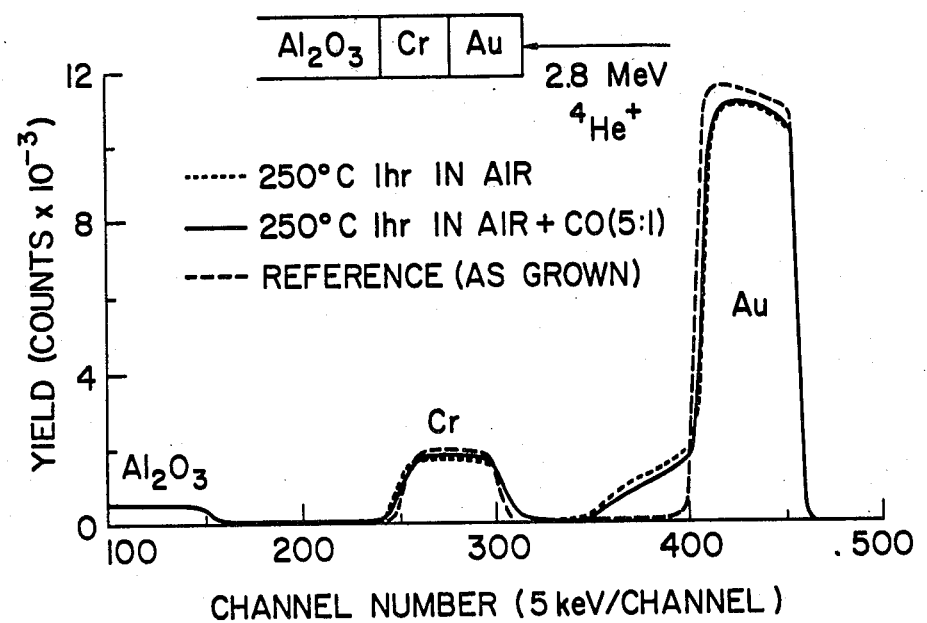

Example I is repeated except that the structure is heated in a mixture of about 5 parts by volume of air per 1 part by volume carbon monoxide at 250° C. for about 1 hour. The results obtained are shown in FIG. 2. As apparent from FIG. 2, the air and carbon monoxide mixture of 5:1 resulted in some reduction of the interdiffusion of the gold and chromium, but not the complete elimination of such as achieved by a ratio of 1:1 of air and carbon monoxide.

What is claimed is:

1. A method for reducing the interdiffusion when at elevated temperature of a first material and a second material which is adjacent to and in intimate contact with the first material, wherein the electronegativity of the first material is different from the electronegativity of the second material, and wherein each of the first material and the second material is a metallic-type electrical conductive material or a semiconductive material or a mixture thereof which method comprises when at elevated temperature of at least about 100° C. exposing at least one surface of said first material containing CO or $O_2$ or both, provided that the gas increases the work function of the first material when it is more electronegative than the second material or decreases the work function of the first material when it is less electronegative than the second material, and thereby reducing the interdiffusion of the first and second materials at their interface and at elevated temperature.

2. The method of claim 1 wherein the first material is located on top of the second material.

3. The method of claim 2 wherein said first material is a layer comprising a metallic-type electrical conductive material.

4. The method of claim 2 wherein the first and second materials are layers about 100 to about 5000 Å thick.

5. The method of claim 2 wherein the first and second materials are layers about 500 to about 3000 Å thick.

6. The method of claim 3 wherein said metallic-type electrical conductive material is polycrystalline gold.

7. The method of claim 6 wherein said second material is a layer of a material selected from the group of chromium, cobalt, copper, silicon, and mixtures thereof.

8. The method of claim 1 wherein said second material is a layer of a material selected from the group of chromium, cobalt, copper, silicon, and mixtures thereof.

9. The method of claim 2 wherein the second material is located on top of a semiconductive substrate.

10. The method of claim 9 wherein said substrate is gallium arsenide.

11. The method of claim 1 wherein said elevated temperature is at least about 100° C.

12. The method of claim 1 wherein said elevated temperature is up to about 500° C.

13. The method of claim 1 wherein said elevated temperature is about 200° to about 350° C.

14. The method of claim 7 wherein said gas is a mixture of carbon monoxide and air.

15. The method of claim 6 wherein said gas is a mixture of carbon monoxide and air in a ratio of about 1:1.

16. The method of claim 6 wherein said second material is less electronegative than said gold.

17. The method of claim 7 wherein said substrate is gallium arsenide.

18. The method of claim 3 wherein said metallic-type electrical conductive material is platinum.

19. The method of claim 18 wherein said second material is less electronegative than said platinum.

20. The method of claim 19 wherein the gas contains $O_2$.

* * * * *

UNITED STATES PATENT AND TRADEMARK OFFICE
CERTIFICATE OF CORRECTION

PATENT NO. : 4,282,043
DATED : August 4, 1981
INVENTOR(S) : Chin-An Chang

It is certified that error appears in the above—identified patent and that said Letters Patent is hereby corrected as shown below:

Column 1, line 68, insert --electrical-- after "metallic-type".
Column 2, line 13, change "electronically" to --electrically--.
Column 4, line 34, change "G,A." to --G.A.--.

Signed and Sealed this

Twenty-seventh Day of October 1981

[SEAL]

Attest:

Attesting Officer

GERALD J. MOSSINGHOFF

Commissioner of Patents and Trademarks